(12) United States Patent
Hong

(10) Patent No.: US 11,205,640 B2
(45) Date of Patent: Dec. 21, 2021

(54) SEMICONDUCTOR PACKAGES HAVING PACKAGE-ON-PACKAGE (POP) STRUCTURES

(71) Applicant: Samsung Electronics Co., Ltd., Suwon-si (KR)

(72) Inventor: Mingi Hong, Hwaseong-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/878,775

(22) Filed: May 20, 2020

(65) Prior Publication Data
US 2021/0104496 A1    Apr. 8, 2021

(30) Foreign Application Priority Data

Oct. 4, 2019  (KR) .................. 10-2019-0122969

(51) Int. Cl.
*H01L 25/065* (2006.01)
*H01L 23/31* (2006.01)
*H01L 23/498* (2006.01)
*H01L 23/00* (2006.01)

(52) U.S. Cl.
CPC ...... *H01L 25/0657* (2013.01); *H01L 23/3121* (2013.01); *H01L 23/49816* (2013.01); *H01L 24/13* (2013.01); *H01L 24/45* (2013.01)

(58) Field of Classification Search
None
See application file for complete search history.

(56) References Cited

U.S. PATENT DOCUMENTS

| | | | |
|---|---|---|---|
| 6,972,216 B2 | 12/2005 | Huang et al. | |
| 7,589,414 B2 | 9/2009 | He et al. | |
| 7,868,439 B2 | 1/2011 | Chang et al. | |
| 8,264,846 B2 | 9/2012 | Jones et al. | |
| 9,299,677 B2 | 3/2016 | Yu et al. | |
| 2004/0084771 A1* | 5/2004 | Bolken | H01L 25/105 257/738 |
| 2004/0178499 A1 | 9/2004 | Mistry et al. | |
| 2008/0029884 A1 | 2/2008 | Grafe et al. | |
| 2008/0105984 A1 | 5/2008 | Lee | |

(Continued)

FOREIGN PATENT DOCUMENTS

| | | |
|---|---|---|
| JP | 4817110 | 11/2011 |
| KR | 101616272 | 8/2015 |

OTHER PUBLICATIONS

Extended European Search Report, dated Nov. 19, 2020, for corresponding European Patent Application No. 20186078.0.

*Primary Examiner* — Long Pham
(74) *Attorney, Agent, or Firm* — Myers Bigel, P.A.

(57) ABSTRACT

Disclosed is a semiconductor package having a package-on-package (PoP) structure in which a signal region and a power region are formed separately. The semiconductor package includes a lower semiconductor package and an upper semiconductor package on the lower semiconductor package. The upper semiconductor package includes an upper package substrate, a memory chip on the upper package substrate, a wire that electrically connects the memory chip to the upper package substrate, a power connector on the upper semiconductor package, a signal connector on the bottom surface of the upper package substrate, and an upper package molding material.

21 Claims, 7 Drawing Sheets

(56) References Cited

U.S. PATENT DOCUMENTS

| | | | |
|---|---|---|---|
| 2013/0099373 A1* | 4/2013 | Kwon | H01L 23/36 |
| | | | 257/737 |
| 2017/0084579 A1* | 3/2017 | Shin | H01L 23/49838 |
| 2018/0105984 A1* | 4/2018 | Eagles | D21F 11/006 |
| 2019/0006339 A1* | 1/2019 | Lau | H01L 25/105 |
| 2019/0103387 A1 | 4/2019 | Tsou et al. | |
| 2021/0104496 A1* | 4/2021 | Hong | H01L 24/45 |

* cited by examiner

SEMICONDUCTOR PACKAGES HAVING PACKAGE-ON-PACKAGE (POP) STRUCTURES

CROSS-REFERENCE TO RELATED APPLICATION

This application claims the benefit of priority under 35 USC § 119 to Korean Patent Application No. 10-2019-0122969, filed on Oct. 4, 2019, in the Korean Intellectual Property Office, the entire contents of which are incorporated herein by reference.

BACKGROUND

1. Field

Example embodiments relate to semiconductor packages. More particularly, example embodiments relate to semiconductor packages having a package-on-package (PoP) structure.

2. Description of Related Art

In the case of a semiconductor package having a PoP structure, the number of signal connectors may be increased in order to increase the bandwidth of data transmission between an upper semiconductor package and a lower semiconductor package of the PoP structure. In a conventional semiconductor package having a PoP structure, power connectors and signal connectors are disposed together in the limited space between the upper semiconductor package and the lower semiconductor package. In order to increase the bandwidth of data transmission, the size of individual terminals may be reduced and the pitch between the terminals may be reduced. However, reducing the size of the individual terminals and reducing the pitch between the terminals may cause a non-wetting problem in which the terminals are disconnected from each other. Therefore, there is the need for development of a semiconductor package structure capable not only of increasing the bandwidth of data transmission but also of preventing poor contact.

SUMMARY

Therefore, the present disclosure has been made in view of the above problems, and it is an object of the present disclosure to provide a semiconductor package having a PoP structure, in which a power connector region and a signal connector region are formed separately from each other such that the power connector is disposed on the top surface of an upper semiconductor package and the signal connector is disposed on the bottom surface of the upper semiconductor package, thereby increasing the size of an individual solder ball, preventing and/or reducing a non-wetting problem, which may occur upon arrangement of a plurality of signal connectors and power connectors in a limited space, increasing the number of signal connectors, and thus increasing the bandwidth of data transmission.

A semiconductor package having a PoP structure according to an embodiment of the present disclosure may include a lower semiconductor package and an upper semiconductor package on the lower semiconductor package. The upper semiconductor package may include an upper package substrate, a memory chip on the upper package substrate, a wire that electrically connects the memory chip to the upper package substrate, a power connector on the upper semiconductor package, a signal connector on the bottom surface of the upper package substrate, and an upper package molding material.

A semiconductor package having a PoP structure according to another embodiment of the present disclosure may include a lower semiconductor package, an interposer on the lower semiconductor package, and an upper semiconductor package on the interposer. The upper semiconductor package may include an upper package substrate, a memory chip on the upper package substrate, a wire that electrically connects the memory chip to the upper package substrate, a power connector on the upper semiconductor package, a signal connector on the bottom surface of the upper package substrate, and an upper package molding material.

A semiconductor system having a PoP structure according to a further embodiment of the present disclosure may include a lower board, an upper board, a lower semiconductor package on the lower board, and an upper semiconductor package on the lower semiconductor package. The lower semiconductor package may include a lower package substrate, an application processor (AP) chip on the lower package substrate, a lower package molding material on the lower package substrate and on the AP chip, and a through-mold via (TMV) in the lower package molding material. The upper semiconductor package may include an upper package substrate, a memory chip on the upper package substrate, a wire that electrically connects the memory chip to the upper package substrate, a power connector on the top surface of the upper semiconductor package, a power bump on the power connector, a signal connector on the bottom surface of the upper package substrate, and an upper package molding material. The gap between the bottom surface of the upper board and the top surface of the upper semiconductor package may be less than 300 µm. The gap between a bottom surface of the upper semiconductor package and a top surface of the lower semiconductor package may be less than 300 µm. The gap between the bottom surface of the lower semiconductor package and the top surface of the lower board may be less than 300 µm.

A semiconductor package having a PoP structure according to a further embodiment of the present disclosure may include a lower semiconductor package and an upper semiconductor package on the lower semiconductor package. The upper semiconductor package may include an upper package substrate, a semiconductor chip on the upper package substrate, an upper package molding material on the upper package substrate and the semiconductor chip, a power connector in the upper package molding material, and a signal connector between the upper package substrate and the lower semiconductor package.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION

Reference will now be made in detail to the embodiments of the present disclosure, examples of which are illustrated in the accompanying drawings. Wherever possible, the same reference numbers will be used throughout the drawings to refer to the same or like parts.

Figure 1:
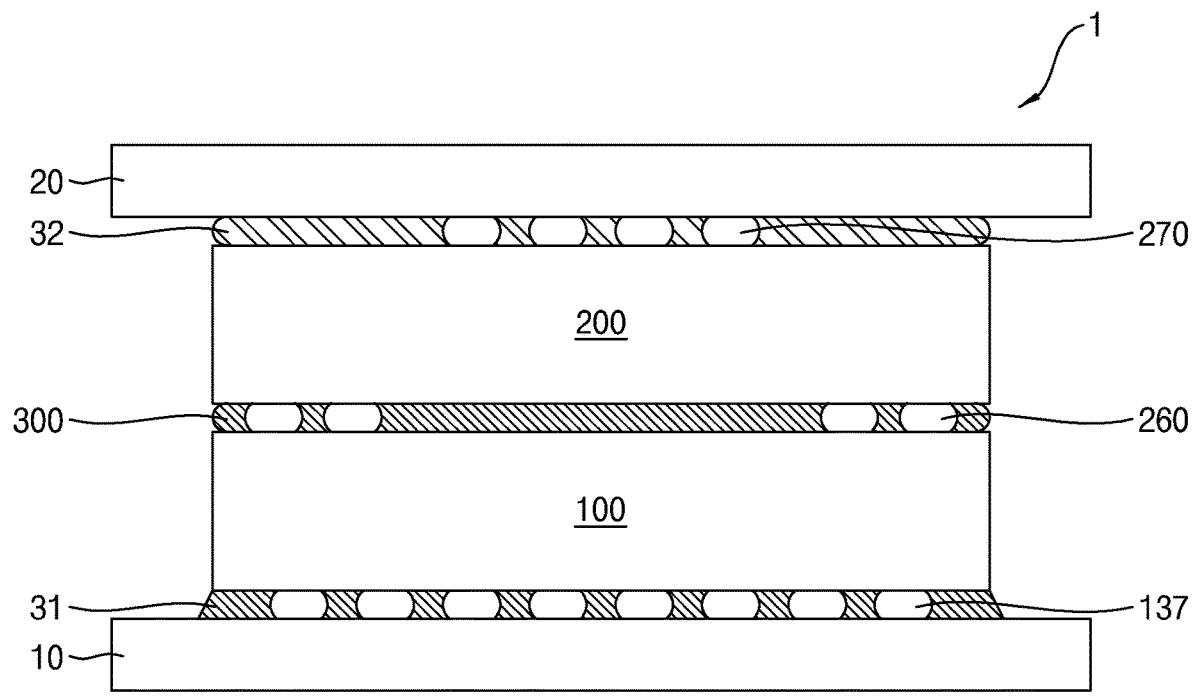
FIG. 1 is a side cross-sectional view of a semiconductor system according to an embodiment of the present disclosure.

FIG. 1 is a side cross-sectional view of a semiconductor system 1 according to an embodiment of the present disclosure. Referring to FIG. 1, a semiconductor system 1 according to an embodiment of the present disclosure may include a lower board 10, an upper board 20, a lower underfill 31, an upper underfill 32, a lower semiconductor package 100, an upper semiconductor package 200, and a package underfill 300. The lower semiconductor package 100 may include a solder 137 disposed on the bottom surface thereof (e.g., between the lower semiconductor package 100 and the lower board 10). The upper semiconductor package 200 may include a signal connector 260 disposed on the bottom surface thereof (e.g., between the upper semiconductor package 200 and the lower semiconductor package 100) and a power bump 270 disposed on the top surface thereof (e.g., between the upper semiconductor package 200 and the upper board 20).

The lower semiconductor package 100 and the upper semiconductor package 200 may be mounted between the lower board 10 and the upper board 20. The lower board 10 and the upper board 20 may connect the lower semiconductor package 100 and the upper semiconductor package 200 to an external circuit (not shown), and may support the lower semiconductor package 100 and the upper semiconductor package 200 and protect the same from external impact. For example, each of the lower board 10 and the upper board 20 may include a printed circuit board (PCB).

The lower board 10 and the upper board 20 may be two-layer motherboards. The lower board 10 and the upper board 20 may be configured as plates that are disposed parallel to each other at a constant interval, and each of them may independently function as a motherboard.

The lower semiconductor package 100 may be mounted on the lower board 10. The lower semiconductor package 100 may be in contact (e.g., electrical contact) with the lower board 10 via the solder 137 disposed on the bottom surface thereof.

The upper semiconductor package 200 may be disposed between the lower semiconductor package 100 and the upper board 20. The upper semiconductor package 200 may be in contact (e.g., electrical contact) with the lower semiconductor package 100 via the signal connector 260 disposed on the bottom surface thereof, and may be in contact (e.g., electrical contact) with the upper board 20 via the power bump 270 disposed on the top surface thereof.

The lower underfill 31 may be disposed between the lower board 10 and the lower semiconductor package 100. The lower underfill 31 may be on and/or fix the solder 137 disposed on the bottom surface of the lower semiconductor package 100, and may support the lower semiconductor package 100 on the lower board 10.

The package underfill 300 may be disposed between the lower semiconductor package 100 and the upper semiconductor package 200. The package underfill 300 may be on and/or fix the signal connector 260 disposed on the bottom surface of the upper semiconductor package 200, and may support the upper semiconductor package 200 on the lower semiconductor package 100.

The upper underfill 32 may be disposed between the upper board 20 and the upper semiconductor package 200. The upper underfill 32 may be on and/or fix the power bump 270 disposed on the top surface of the upper semiconductor package 200, and may support the upper board 20 on the upper semiconductor package 200.

Figure 2:
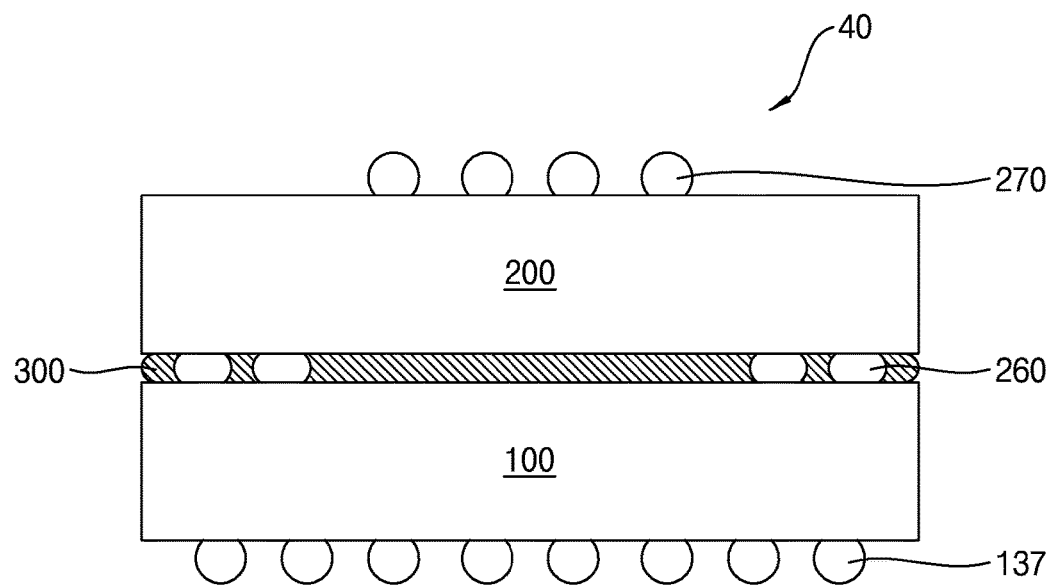
FIG. 2 is a side cross-sectional view of a semiconductor package according to an embodiment of the present disclosure.

FIG. 2 is a side cross-sectional view of a semiconductor package 40 according to an embodiment of the present disclosure. Referring to FIG. 2, a semiconductor package 40 according to an embodiment of the present disclosure may include a lower semiconductor package 100, an upper semiconductor package 200, and a package underfill 300. In some embodiments, a power bump 270 may be disposed on the top surface of the upper semiconductor package 200 and a solder 137 may be disposed on the bottom surface of the lower semiconductor package 100. In some embodiments, the power bump 270 disposed on the top surface of the upper semiconductor package 200 may be omitted. In some embodiments, the semiconductor package 40 may be coupled to an upper and lower board 10, 20 to form the semiconductor system 1. As will be described further herein, embodiments of the present disclosure include, in part, improved configurations of the lower semiconductor package 100 and/or the upper semiconductor package 200.

Figure 3:
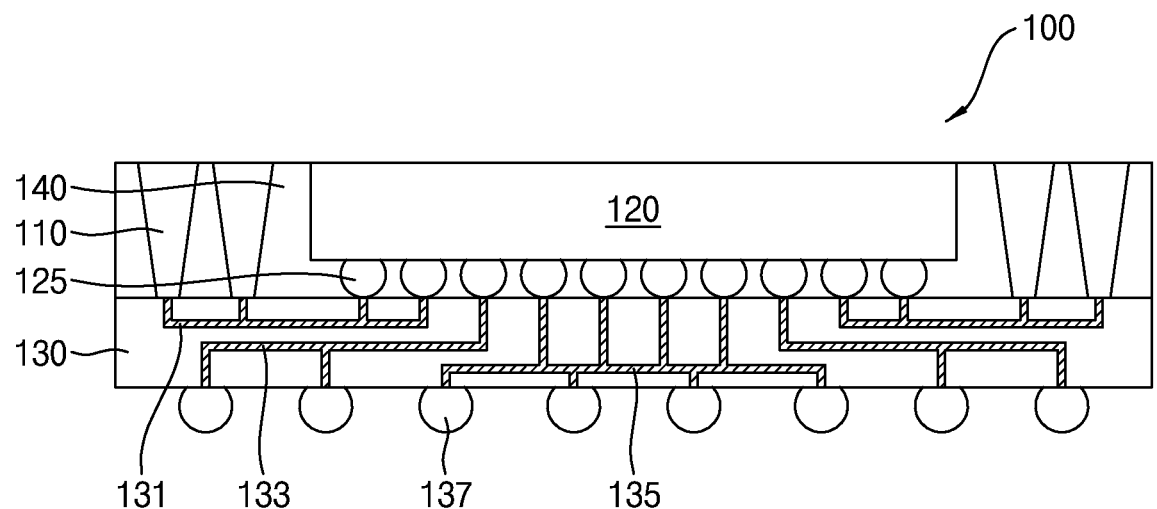
FIG. 3 is a side cross-sectional view of a lower semiconductor package according to an embodiment of the present disclosure.

FIG. 3 is a side cross-sectional view of a lower semiconductor package 100 according to an embodiment of the present disclosure. Referring to FIG. 3, the lower semiconductor package 100 may include a through-mold via (TMV) 110, an application processor (AP) chip 120 (e.g., a first semiconductor chip), a chip bump 125, a lower package substrate 130, a solder 137, and a lower package molding material 140.

The TMV 110 may be disposed in the lower package molding material 140. The TMV 110 may be filled with a conductive material. It will be understood that "an element A fills an element B" (or similar language) as used herein means that the element A is in the element B but does not necessarily mean that the element A fills the element B entirely. The lower end of the TMV 110 may be in contact with the lower package substrate 130, and the upper end of the TMV 110 may be in contact with a signal connector 260 of an upper semiconductor package 200 (e.g., see FIG. 5). The TMV 110 may provide a signal transmission path between the upper semiconductor package 200 and the lower semiconductor package 100.

The AP chip 120 may be mounted on the lower package substrate 130. The AP chip 120 may be electrically connected to the lower package substrate 130 via the chip bump 125.

The lower package substrate 130 may support the AP chip 120 and protect the same from external impact. For example, the lower package substrate 130 may include a printed circuit board (PCB) or a silicon interposer. The AP chip 120 may be mounted on the top surface of the lower package substrate 130. The solder 137 may be disposed on the bottom surface of the lower package substrate 130 (e.g., opposite the lower package substrate 130 from the AP chip 120).

The lower package substrate 130 may include an internal signal wiring line 131, an external signal wiring line 133, and a lower package power wiring line 135. The internal signal wiring line 131 may electrically connect the TMV 110 to the AP chip 120. The internal signal wiring line 131 may provide a signal transmission path between the AP chip 120 of the lower semiconductor package 100 and a memory chip 210 (e.g., a second semiconductor chip) of an upper semiconductor package 200 (e.g., see FIG. 5) within the semiconductor package 40. The signal from the memory chip 210 of the upper semiconductor package 200 may be transmitted to the AP chip 120 via the path including the TMV 110, the internal signal wiring line 131, and the chip bump 125.

The external signal wiring line 133 may electrically connect the AP chip 120 to the solder 137 disposed on the bottom surface of the lower package substrate 130. The external signal wiring line 133 may provide a path for transmitting a signal from the AP chip 120 of the lower semiconductor package 100 to the lower board 10 outside the semiconductor package 40 (e.g., when the lower semiconductor package 100 is coupled as illustrated in FIGS. 1 and/or 2).

The lower package power wiring line 135 may electrically connect the AP chip 120 to the solder 137 disposed on the bottom surface of the lower package substrate 130. The lower package power wiring line 135 may provide a path for receiving driving power for the lower semiconductor package 100 from the lower board 10. In some embodiments, the position of the lower package power wiring line 135 and the position of the external signal wiring line 133 may be interchanged.

The lower package molding material 140 may be disposed on the lower package substrate 130, and may be on and/or cover the AP chip 120. The lower package molding material 140 may be a housing that is produced through a molding process and protects the AP chip 120 from the external environment. The lower package molding material 140 may include, for example, an epoxy molding compound (EMC). In some embodiments, the top surface of the AP chip 120 may not be covered with the lower package molding material 140, but may be exposed.

Figure 4:
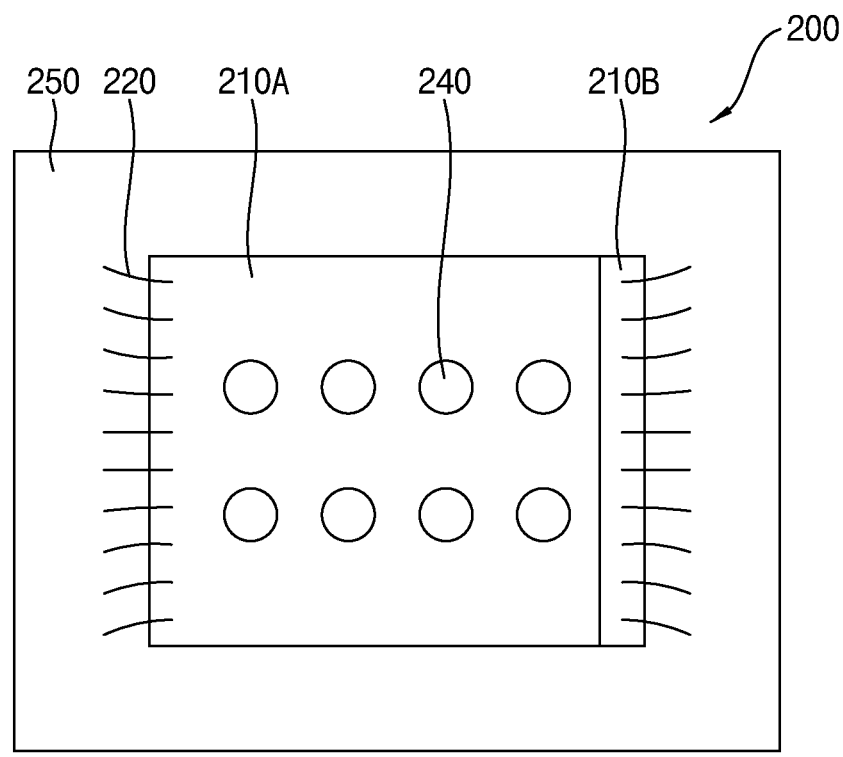
FIG. 4 is a top view of an upper semiconductor package according to an embodiment of the present disclosure.
Figure 5:
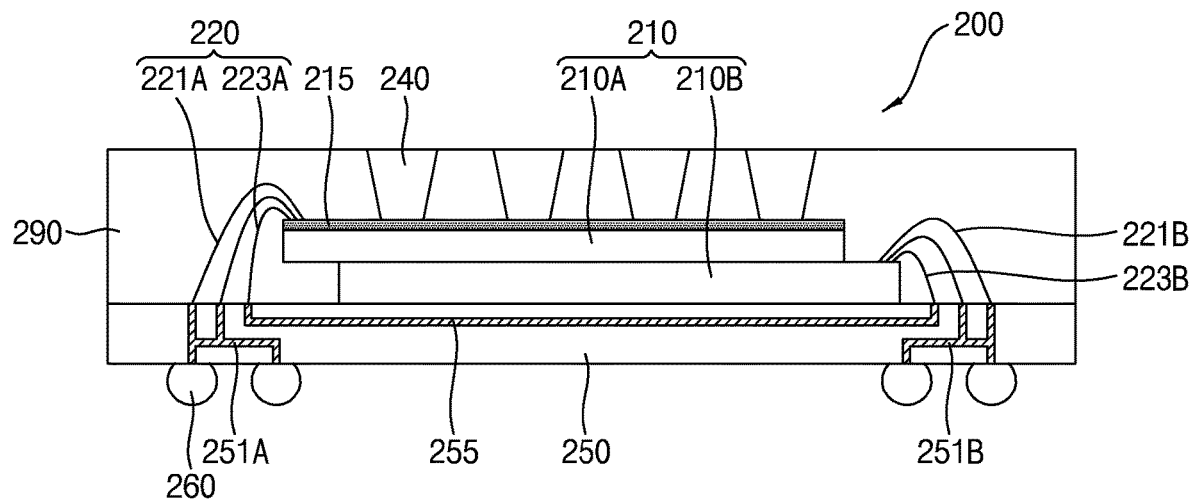
FIG. 5 is a side cross-sectional view of an upper semiconductor package according to an embodiment of the present disclosure.

FIG. 4 is a top view of an upper semiconductor package 200 according to an embodiment of the present disclosure, and FIG. 5 is a side cross-sectional view of an upper semiconductor package 200 according to an embodiment of the present disclosure. For example, FIG. 5 may represent the cross-sectional view of FIG. 4. Referring to FIGS. 4 and 5, the upper semiconductor package 200 may include a memory chip 210, a redistribution layer 215, a wire 220, a power connector 240, an upper package substrate 250, a signal connector 260, and an upper package molding material 290.

The memory chip 210 may be mounted on the upper package substrate 250. The memory chip 210 may include, for example, a dynamic random access memory (DRAM) chip. The memory chip 210 may include a lower memory chip 210B and an upper memory chip 210A stacked on the lower memory chip 210B. In some embodiments, the lower memory chip 210B may be between the upper memory chip 210A and the upper package substrate 250. The redistribution layer 215 may be disposed on the upper memory chip 210A.

The redistribution layer 215 may include a redistribution circuit disposed among and/or electrically connected to the power connector 240, the wire 220, and the memory chip 210. In some embodiments, the redistribution layer 215 may be included in the upper memory chip 210A.

The wire 220 may electrically connect the upper package substrate 250 to the memory chip 210. The wire 220 may include signal wires 221A and 221B, which are connected to signal wiring lines 251A and 251B in the upper package substrate 250, and power wires 223A and 223B, which are connected to a memory chip power wiring line 255 in the upper package substrate 250.

The power connector 240 may be disposed on the top surface of the upper semiconductor package 200 while penetrating the upper package molding material 290. Driving power may be supplied to the memory chip 210 through the power connector 240. One end of the power connector 240 may be in contact with the top surface of the memory chip 210 or with the redistribution layer 215 disposed on the memory chip 210. The opposite end of the power connector 240 may be upwardly exposed above the upper package molding material 290, and may be in contact with the power bump 270 (e.g., when configured as in FIGS. 1 and/or 2).

The upper package substrate 250 may support the memory chip 210 and protect the same from external impact. For example, the upper package substrate 250 may include a PCB or a silicon interposer. The memory chip 210 may be mounted on the top surface of the upper package substrate 250. A signal connector 260, such as a solder ball, may be disposed on the bottom surface of the upper package substrate 250.

The upper package substrate 250 may include an upper chip signal wiring line 251A, a lower chip signal wiring line 251B, and the memory chip power wiring line 255.

The upper chip signal wiring line 251A may electrically connect the signal wire 221A, connected to the upper memory chip 210A, to the signal connector 260. The upper chip signal wiring line 251A may provide a path for transmitting a signal from the upper memory chip 210A to the AP chip 120 of the lower semiconductor package 100.

The lower chip signal wiring line 251B may electrically connect the signal wire 221B, connected to the lower memory chip 210B, to the signal connector 260. The lower chip signal wiring line 251B may provide a path for transmitting a signal from the lower memory chip 210B to the AP chip 120 of the lower semiconductor package 100.

The memory chip power wiring line 255 may electrically connect the power wire 223A, connected to the upper memory chip 210A, to the power wire 223B, connected to the lower memory chip 210B. The memory chip power wiring line 255 may provide a path for supplying driving power to the lower memory chip 210B.

The signal connector 260 and the power bump 270 may include solder balls. The signal connector 260 may connect the upper semiconductor package 200 to the lower semiconductor package 100 or to the interposer 400 (see, e.g., FIG. 14), and may provide a signal transmission path between the upper semiconductor package 200 and the lower semiconductor package 100. The power bump 270 may connect the upper semiconductor package 200 to the upper board 20, and may transmit driving power from the upper board 20 to the upper semiconductor package 200.

The upper package molding material 290 may be disposed on the upper package substrate 250, and may be on and/or cover the memory chip 210 and the wire 220. The upper package molding material 290 may be a housing that is produced through a molding process and may protect the memory chip 210 and the wire 220 from the external environment. The upper package molding material 290 may include, for example, an EMC.

Referring to FIGS. 4 and 5, the power connector 240 may be disposed on the memory chip 210 when the upper semiconductor package 200 is viewed from above. Referring to FIG. 5, the power supply path to the upper memory chip 210A may include the power connector 240 and the redistribution layer 215. The power supply path to the lower memory chip 210B may include the power connector 240, the redistribution layer 215, the power wire 223A connected to the upper memory chip 210A, the memory chip power wiring line 255, and the power wire 223B connected to the lower memory chip 210B.

Referring to FIG. 5, a signal from the upper memory chip 210A may be transmitted to the lower semiconductor package 100 via the path including the redistribution layer 215, the signal wire 221A, the upper chip signal wiring line 251A, and the signal connector 260. A signal from the lower memory chip 210B may be transmitted to the lower semiconductor package 100 via the path including the signal wire 221B, the lower chip signal wiring line 251B, and the signal connector 260.

Though FIGS. 2 to 5 refer to AP chip 120 and memory chip 210, it will be understood that the present disclosure is not limited to these embodiments. In some embodiments, the lower semiconductor package 100 may include a first semiconductor chip 120 and the upper semiconductor package 200 may include a second semiconductor chip 210.

Figure 6:
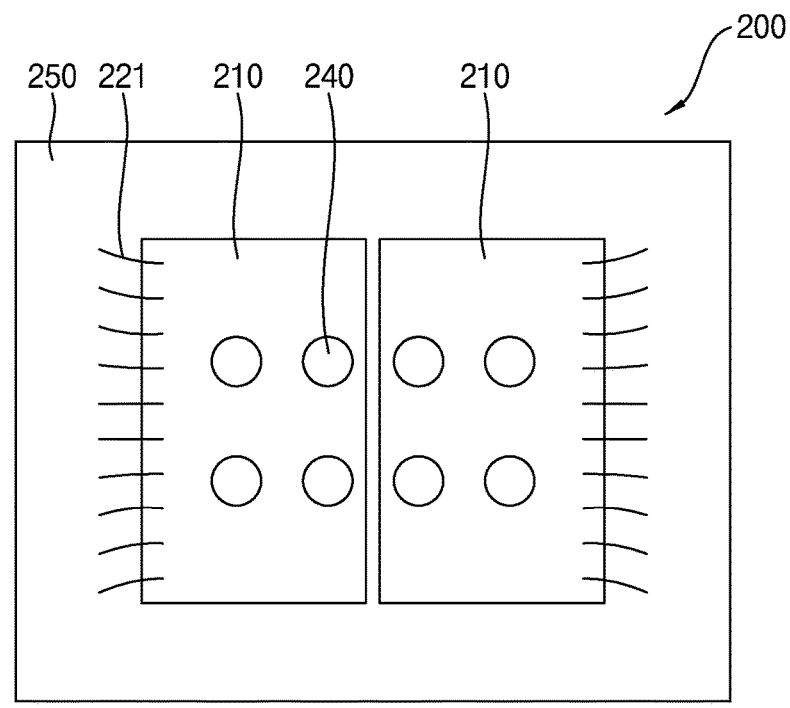
FIG. 6 is a top view of an upper semiconductor package according to an embodiment of the present disclosure.
Figure 7:
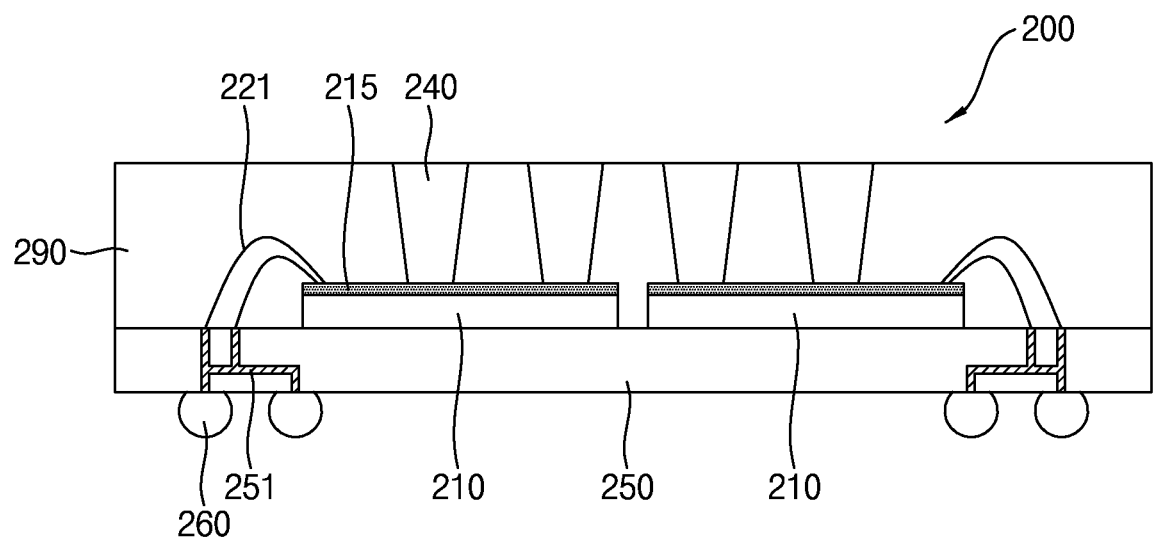
FIG. 7 is a side cross-sectional view of an upper semiconductor package according to an embodiment of the present disclosure.

FIG. 6 is a top view of an upper semiconductor package 200 according to an embodiment of the present disclosure, and FIG. 7 is a side cross-sectional view of an upper semiconductor package 200 according to an embodiment of the present disclosure. For example, FIG. 7 may represent the cross-sectional view of FIG. 6. Referring to FIGS. 6 and 7, a memory chip 210 may include two chips, which are disposed side by side at the same level. Referring to FIG. 7, each memory chip 210 may include a redistribution layer 215 disposed thereon.

Referring to FIG. 7, an upper package substrate 250 may include a signal wiring line 251. The signal wiring line 251 may electrically connect a signal wire 221, connected to each memory chip 210, to a signal connector 260. The power supply path to each memory chip 210 may include a power connector 240 and the redistribution layer 215. A signal from each memory chip 210 may be transmitted to the lower semiconductor package 100 via the path including the redistribution layer 215, the signal wire 221, the signal wiring line 251, and the signal connector 260. In some embodiments, the signal wire 221 may represent the wire 220 described with respect to other figures.

Figure 8:
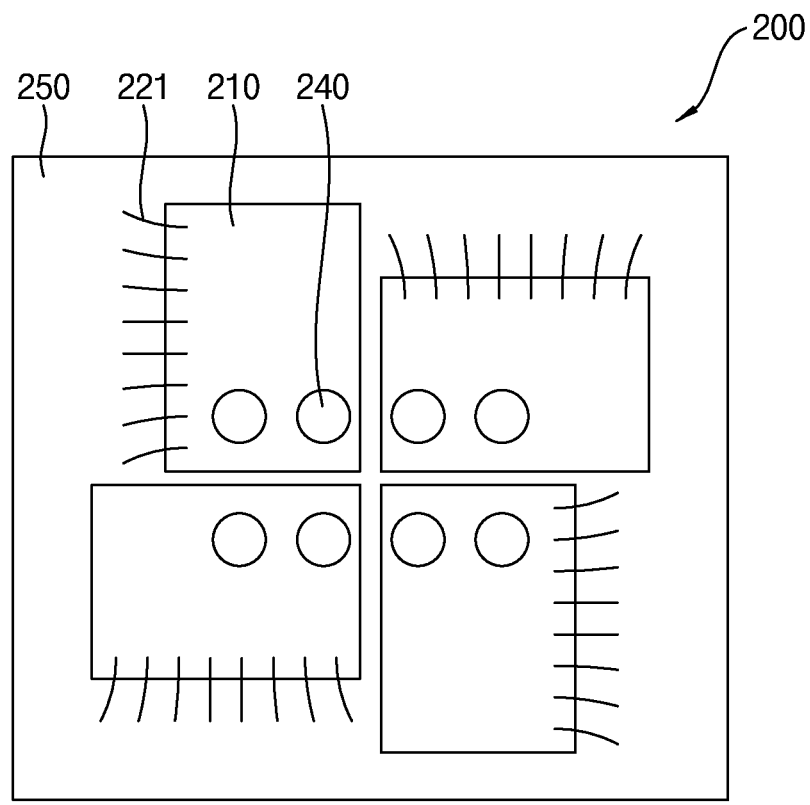
FIG. 8 is a top view of an upper semiconductor package according to an embodiment of the present disclosure.
Figure 9:
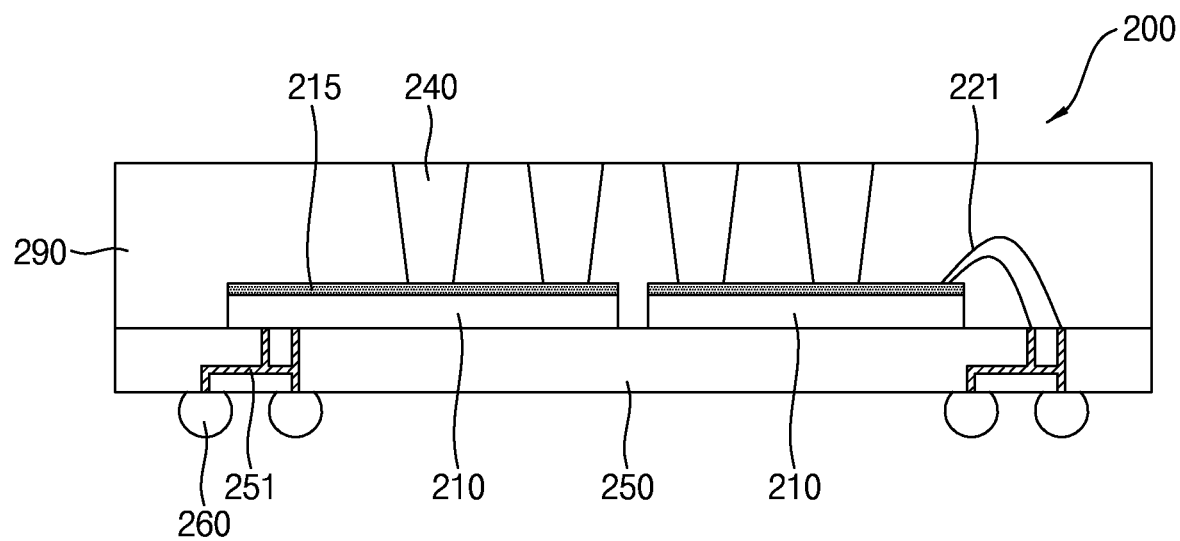
FIG. 9 is a side cross-sectional view of an upper semiconductor package according to an embodiment of the present disclosure.

FIG. 8 is a top view of an upper semiconductor package 200 according to an embodiment of the present disclosure, and FIG. 9 is a side cross-sectional view of an upper semiconductor package 200 according to an embodiment of the present disclosure. For example, FIG. 9 may represent the cross-sectional view of FIG. 8. Referring to FIGS. 8 and 9, a memory chip 210 may include four chips, which are disposed in a pinwheel pattern at the same level. In some embodiments, a corner of each of the four chips may be adjacent a corner of each of the other three chips. Referring to FIG. 9, each memory chip 210 may include a redistribution layer 215 disposed thereon.

Referring to FIG. 9, an upper package substrate 250 may include a signal wiring line 251. The signal wiring line 251 may electrically connect a signal wire 221, connected to each memory chip 210, to a signal connector 260. The power supply path to each memory chip 210 may include a power connector 240 and the redistribution layer 215. A signal from each memory chip 210 may be transmitted to the lower semiconductor package 100 via the path including the redistribution layer 215, the signal wire 221, the signal wiring line 251, and the signal connector 260. In some embodiments, the signal wire 221 may represent the wire 220 described with respect to other figures.

Figure 10:
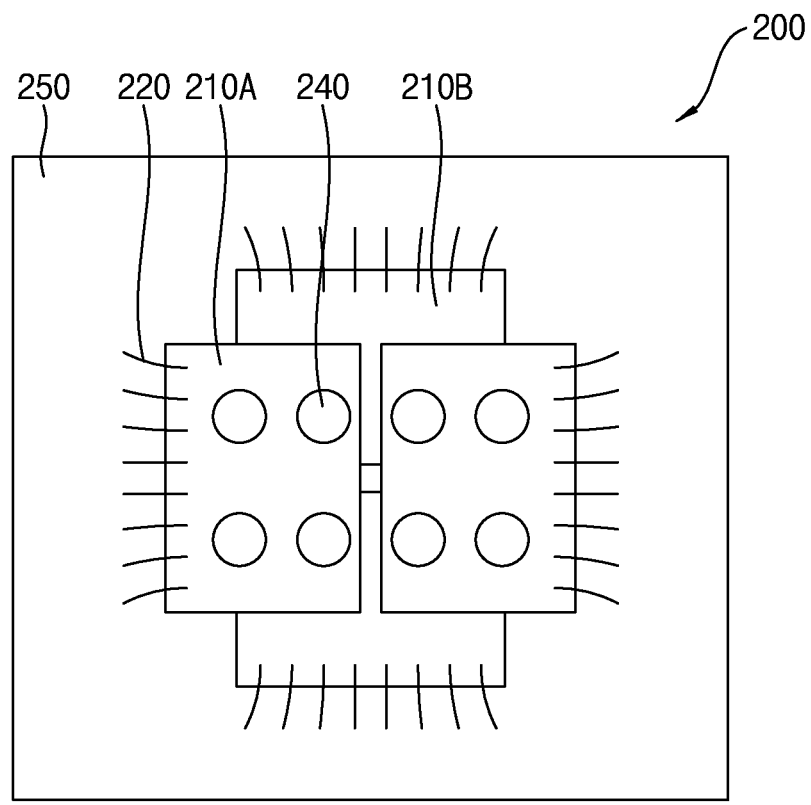
FIG. 10 is a top view of an upper semiconductor package according to an embodiment of the present disclosure.
Figure 11:
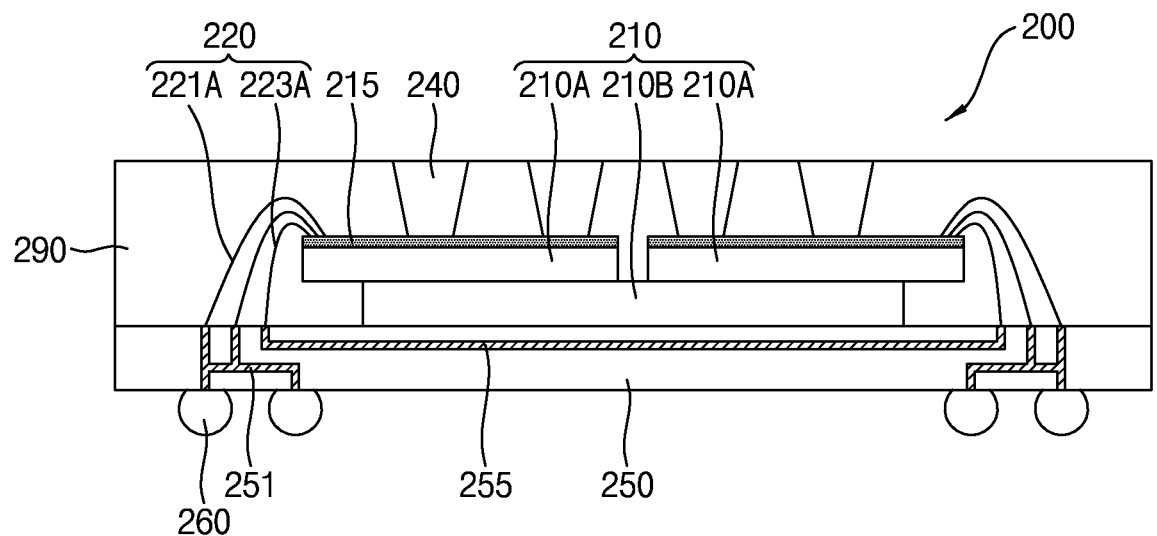
FIG. 11 is a side cross-sectional view of an upper semiconductor package according to an embodiment of the present disclosure.

FIG. 10 is a top view of an upper semiconductor package 200 according to an embodiment of the present disclosure, and FIG. 11 is a side cross-sectional view of an upper semiconductor package 200 according to an embodiment of the present disclosure. For example, FIG. 11 may represent the cross-sectional view of FIG. 10. Referring to FIGS. 10 and 11, a memory chip 210 may include two lower memory chips 210B, which are disposed side by side, and two upper memory chips 210A, which are disposed side by side on the lower memory chips 210B. Each of the upper memory chips 210A may be stacked on the two lower memory chips 210B so as to cover at least a portion of each of the two lower memory chips 210B. Referring to FIG. 11, each of the upper memory chips 210A may include a redistribution layer 215 disposed thereon.

Referring to FIG. 11, the power supply path to each of the upper memory chips 210A may include a power connector 240 and the redistribution layer 215. The power supply path to the lower memory chips 210B may include the power connector 240, the redistribution layer 215, a power wire 223A connected to at least one of the upper memory chips 210A, a memory chip power wiring line 255, and a power wire (not shown) connected to the lower memory chips 210B.

Referring to FIG. 11, a signal from each of the upper memory chips 210A may be transmitted to the lower semiconductor package 100 via the path including the redistribution layer 215, a signal wire 221A, a signal wiring line 251, and a signal connector 260.

Figure 12:
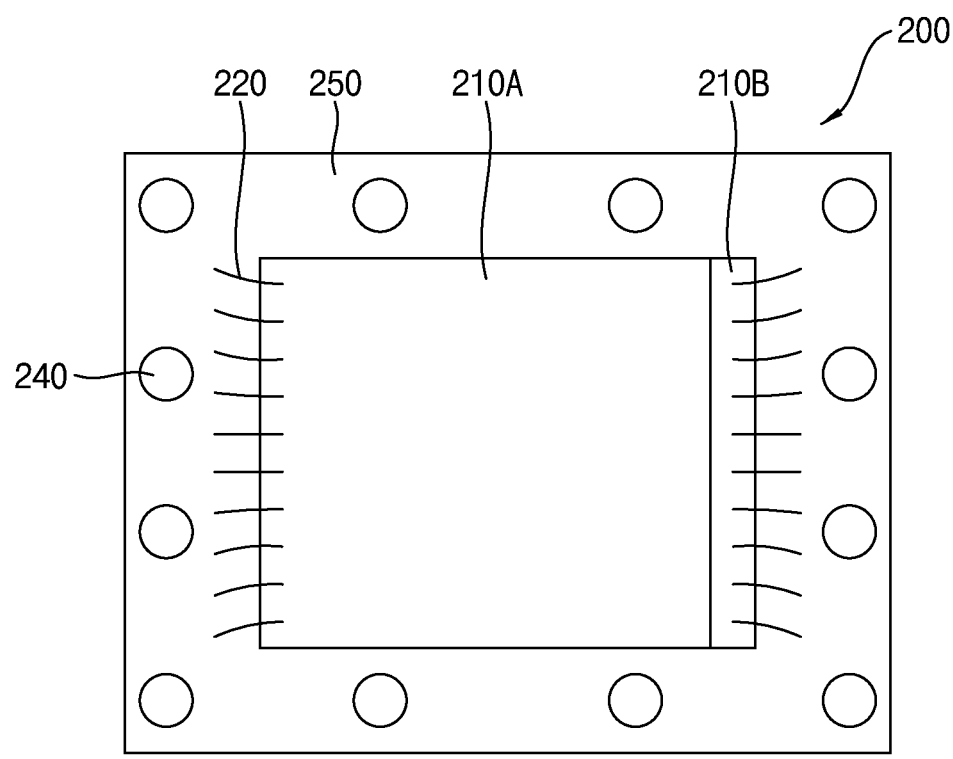
FIG. 12 is a top view of an upper semiconductor package according to an embodiment of the present disclosure.
Figure 13:
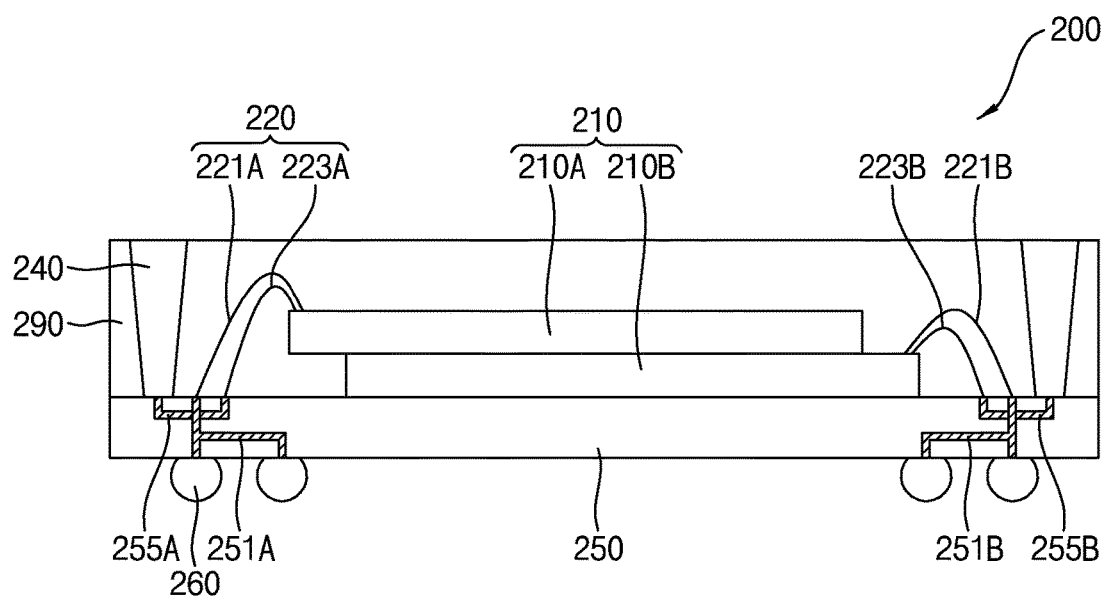
FIG. 13 is a side cross-sectional view of an upper semiconductor package according to an embodiment of the present disclosure.

FIG. 12 is a top view of an upper semiconductor package 200 according to an embodiment of the present disclosure, and FIG. 13 is a side cross-sectional view of an upper semiconductor package 200 according to an embodiment of the present disclosure. For example, FIG. 13 may represent the cross-sectional view of FIG. 12. Referring to FIGS. 12 and 13, a power connector 240 may be disposed on a portion of the upper semiconductor package 200 in which a memory chip 210 is not disposed when the upper semiconductor package 200 is viewed from above.

Referring to FIG. 13, the upper package substrate 250 may include upper and lower chip signal wiring lines 251A and 251B and upper and lower chip power wiring lines 255A and 255B. The upper chip signal wiring line 251A may electrically connect an upper chip signal wire 221A to a signal connector 260, and the lower chip signal wiring line 251B may electrically connect a lower chip signal wire 221B to the signal connector 260. The upper chip power wiring line 255A may electrically connect an upper chip power wire 223A to the power connector 240, and the lower chip power wiring line 255B may electrically connect a lower chip power wire 223B to the power connector 240.

The power supply path to the upper memory chip 210A may include the power connector 240, the upper chip power wiring line 255A, and the upper chip power wire 223A. The power supply path to the lower memory chip 210B may include the power connector 240, the lower chip power wiring line 255B, and the lower chip power wire 223B.

A signal from the upper memory chip 210A may be transmitted to the lower semiconductor package 100 via the path including the upper chip signal wire 221A, the upper chip signal wiring line 251A, and the signal connector 260. A signal from the lower memory chip 210B may be transmitted to the lower semiconductor package 100 via the path including the lower chip signal wire 221B, the lower chip signal wiring line 251B, and the signal connector 260.

Figure 14:
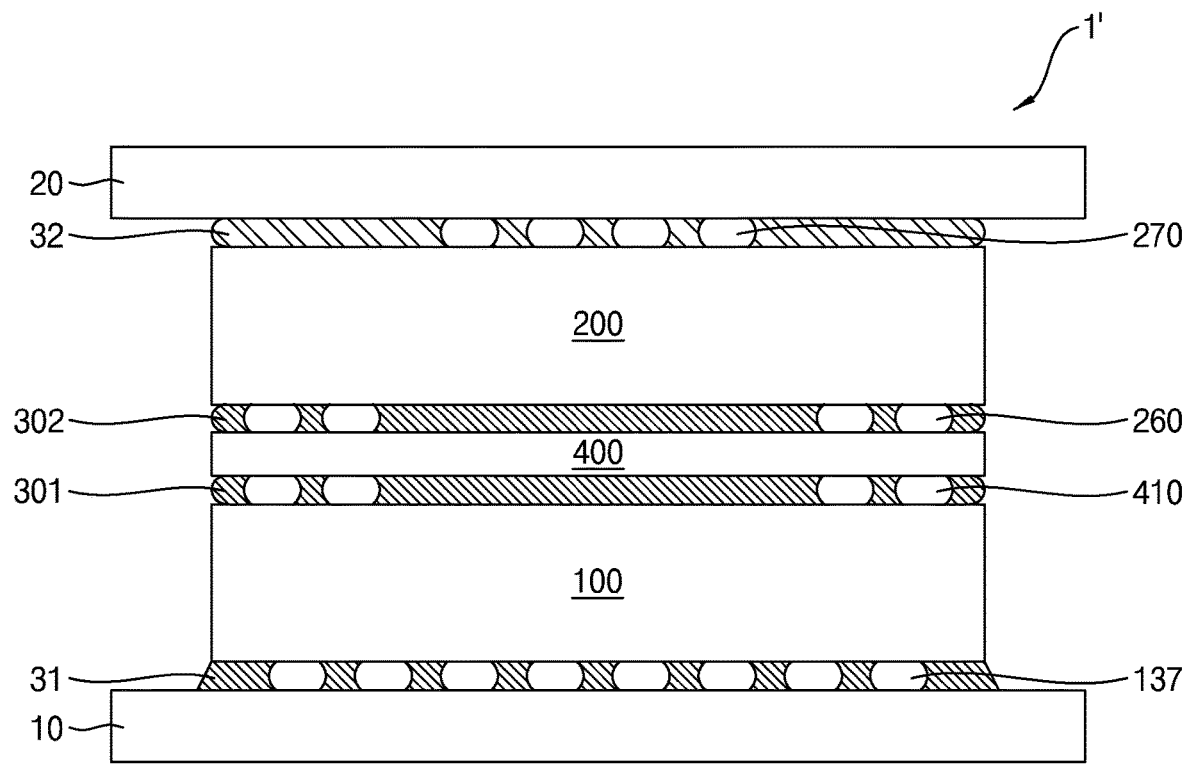
FIG. 14 is a side cross-sectional view of a semiconductor system according to an embodiment of the present disclosure.

FIG. 14 is a side cross-sectional view of a semiconductor system 1' according to an embodiment of the present disclosure. Referring to FIG. 14, the semiconductor system 1' may further include an interposer 400. The interposer 400 may be disposed on a lower semiconductor package 100. The interposer 400 may be disposed between an upper semiconductor package 200 and the lower semiconductor package 100 so as to electrically connect the upper semiconductor package 200 to the lower semiconductor package 100. The interposer 400 may include an interposer bump 410, which may be partially inserted into a TMV 110 (see, e.g., FIG. 3) of the lower semiconductor package 100. The interposer 400 may include, for example, silicon, an organic substrate, or a printed circuit board (PCB), and may further include a redistribution layer. The interposer bump 410 may include, for example, a solder. A portion of the interposer bump 410 may be inserted into the TMV 110 (see, e.g., FIG. 3) of the lower semiconductor package 100, and may be in contact with a conductive material disposed in the TMV 110.

In some embodiments, a first package underfill 301 may be disposed between the lower semiconductor package 100 and the interposer 400. The first package underfill 301 may be on and/or fix the interposer bump 410 disposed on the bottom surface of the interposer 400. In some embodiments, a second package underfill 302 may be disposed between the upper semiconductor package 200 and the interposer 400. The second package underfill 302 may be on and/or fix the signal connector 260 disposed on the bottom surface of the upper semiconductor package 200.

In some embodiments, a vertical gap between the bottom surface of the upper board 20 and the top surface of the upper semiconductor package 200 may be less than 300 µm. In some embodiments, a vertical gap between the bottom surface of the upper semiconductor package 200 and the top surface of the lower semiconductor package 100 may be less than 300 µm. In some embodiments, a vertical gap between the bottom surface of the lower semiconductor package 100 and the top surface of the lower board 10 may be less than 300 µm.

In some embodiments, the solder 137 of the lower semiconductor package 100, the signal connector 260 and/or the power bump 270 of the upper semiconductor package 200, and/or the interposer bump 410 of the interposer 400 may have a diameter less than 350 µm.

As described above, in the semiconductor package 40 having a PoP structure according to an embodiment of the present disclosure or in the semiconductor systems 1, 1' including the same, the signal connector 260 and the power connector 240 of the upper semiconductor package 200 may be disposed in different respective spaces, thereby increasing space efficiency. That is, the signal connector 260 may be disposed on the bottom surface of the upper semiconductor package 200 in order to exchange a signal with the lower semiconductor package 100, and the power connector 240 may be disposed on the top surface of the upper semiconductor package 200 in order to receive driving power for the upper semiconductor package 200 from the upper board 20, which may be a two-layer motherboard. Accordingly, it is possible to increase the number of signal connectors 260 without reducing the size of the bumps 260 and 270 for transmitting a signal or power, thereby increasing the bandwidth of data transmission and preventing and/or reducing a non-wetting problem.

As is apparent from the above description, the present disclosure provides a semiconductor package having a PoP structure, in which a power connector region and a signal connector region are formed separately from each other such that the power connector is disposed on the top surface of an upper semiconductor package and the signal connector is disposed on the bottom surface of the upper semiconductor package. The semiconductor package having a PoP structure according to some embodiments of the present disclosure may enable an increase in the size of an individual solder ball. Accordingly, the semiconductor package having a PoP structure according to some embodiments of the present disclosure may prevent and/or reduce a non-wetting problem, which may occur upon arrangement of a plurality of signal connectors and power connectors in a limited space. In addition, the semiconductor package having a PoP structure according to some embodiments of the present disclosure may enable an increase in the number of signal connectors, thereby increasing the bandwidth of data transmission.

While the present disclosure has been particularly shown and described with reference to example embodiments thereof, it will be apparent to those skilled in the art that various changes in form and detail may be made without departing from the scope of the present disclosure. The above embodiments are therefore to be construed in all aspects as illustrative and not restrictive.

What is claimed is:

1. A semiconductor package comprising:
a lower semiconductor package; and
an upper semiconductor package on the lower semiconductor package,
wherein the upper semiconductor package comprises:
an upper package substrate;
a memory chip on the upper package substrate;
a wire that electrically connects the memory chip to the upper package substrate;
a power connector in the upper semiconductor package;
a signal connector on a bottom surface of the upper package substrate; and
an upper package molding material,
wherein a portion of the power connector is exposed from the upper package molding material at a top surface of the upper semiconductor package, and
wherein the portion of the power connector comprises at least a portion positioned higher than the memory chip.

2. The semiconductor package according to claim 1, wherein the lower semiconductor package comprises:
a lower package substrate;
an application processor (AP) chip on the lower package substrate;

a lower package molding material on the lower package substrate and on the AP chip; and a through-mold via (TMV) in the lower package molding material, and wherein the lower package substrate comprises an internal signal wiring line, an external signal wiring line, and a lower package power wiring line.

3. The semiconductor package according to claim 2, wherein the external signal wiring line and/or the lower package power wiring line electrically connects the AP chip to a solder on a bottom surface of the lower package substrate.

4. The semiconductor package according to claim 2, further comprising an interposer between the lower semiconductor package and the signal connector, wherein the interposer comprises an interposer bump, and wherein an upper end of the TMV is in contact with the interposer bump.

5. The semiconductor package according to claim 1, wherein the memory chip comprises a lower memory chip and an upper memory chip on the lower memory chip, wherein the wire comprises a signal wire and a power wire, wherein the upper package substrate comprises an upper chip signal wiring line, a lower chip signal wiring line, and a memory chip power wiring line, wherein the signal wire is electrically connected to the upper memory chip, and wherein the upper chip signal wiring line electrically connects the signal wire to the signal connector.

6. The semiconductor package according to claim 1, wherein the memory chip comprises a lower memory chip and an upper memory chip on the lower memory chip, wherein the wire comprises a signal wire and a power wire, wherein the upper package substrate comprises an upper chip signal wiring line, a lower chip signal wiring line, and a memory chip power wiring line, wherein the signal wire is electrically connected to the lower memory chip, and wherein the lower chip signal wiring line electrically connects the signal wire to the signal connector.

7. The semiconductor package according to claim 1, wherein the memory chip comprises a lower memory chip and an upper memory chip on the lower memory chip, wherein the wire comprises a signal wire and a power wire, wherein the upper package substrate comprises an upper chip signal wiring line, a lower chip signal wiring line, and a memory chip power wiring line, wherein the power wire comprises a first power wire that is electrically connected to the upper memory chip and a second power wire that is electrically connected to the lower memory chip, and wherein the memory chip power wiring line electrically connects the first power wire to the second power wire.

8. The semiconductor package according to claim 1, wherein the memory chip comprises a lower memory chip and an upper memory chip on the lower memory chip, wherein the wire comprises a signal wire and a power wire, wherein the upper package substrate comprises a signal wiring line and a memory chip power wiring line, wherein the signal wiring line electrically connects the signal wire to the signal connector, and wherein the memory chip power wiring line electrically connects the power wire to the power connector.

9. A semiconductor system, comprising:

a lower board;

an upper board;

a lower semiconductor package on the lower board; and an upper semiconductor package on the lower semiconductor package, wherein the lower semiconductor package comprises:

a lower package substrate;

an application processor (AP) chip on the lower package substrate;

a lower package molding material on the lower package substrate and on the AP chip; and a through-mold via (TMV) in the lower package molding material, wherein the upper semiconductor package comprises:

an upper package substrate;

a memory chip on the upper package substrate;

a wire that electrically connects the memory chip to the upper package substrate;

a power connector on a top surface of the upper semiconductor package;

a power bump on the power connector;

a signal connector on a bottom surface of the upper package substrate; and an upper package molding material, wherein a gap between a bottom surface of the upper board and the top surface of the upper semiconductor package is less than 300 μm, wherein a gap between a bottom surface of the upper semiconductor package and a top surface of the lower semiconductor package is less than 300 μm, and wherein a gap between a bottom surface of the lower semiconductor package and a top surface of the lower board is less than 300 μm.

10. The semiconductor system according to claim 9, wherein the lower package substrate comprises an internal signal wiring line, an external signal wiring line, and a lower package power wiring line, and wherein the internal signal wiring line electrically connects the TMV to the AP chip.

11. The semiconductor system according to claim 9, wherein the lower package substrate comprises an internal signal wiring line, an external signal wiring line, and a lower package power wiring line, and wherein the external signal wiring line and/or the lower package power wiring line electrically connects the AP chip to a solder on a bottom surface of the lower package substrate.

12. The semiconductor system according to claim 9, wherein the memory chip comprises a lower memory chip and an upper memory chip on the lower memory chip, wherein the wire comprises a signal wire and a power wire, and wherein the upper package substrate comprises an upper chip signal wiring line, a lower chip signal wiring line, and a memory chip power wiring line.

13. The semiconductor system according to claim 12, wherein the signal wire is electrically connected to the upper memory chip, and wherein the upper chip signal wiring line electrically connects the signal wire to the signal connector.

14. The semiconductor system according to claim 12, wherein the signal wire is electrically connected to the lower memory chip, and wherein the lower chip signal wiring line electrically connects the signal wire to the signal connector.

15. The semiconductor system according to claim 12, wherein the power wire is electrically connected to the upper memory chip, and
wherein the memory chip power wiring line electrically connects the power wire to another power wire that is electrically connected to the lower memory chip.

16. A semiconductor package, comprising:
a lower semiconductor package; and
an upper semiconductor package on the lower semiconductor package,
wherein the upper semiconductor package comprises:
an upper package substrate;
a semiconductor chip on the upper package substrate;
an upper package molding material on the upper package substrate and the semiconductor chip;
a power connector extending vertically in the upper package molding material between a top surface of the upper semiconductor package and the semiconductor chip; and
a signal connector between the upper package substrate and the lower semiconductor package.

17. The semiconductor package according to claim 16, wherein the semiconductor chip on the upper semiconductor package is a second semiconductor chip, wherein the lower semiconductor package comprises:
a lower package substrate;
a first semiconductor chip on the lower package substrate;
a lower package molding material on the lower package substrate and on the first semiconductor chip; and
a through-mold via (TMV) in the lower package molding material, and
wherein the lower package substrate comprises an internal signal wiring line, an external signal wiring line, and a lower package power wiring line.

18. The semiconductor package according to claim 17, wherein the external signal wiring line and/or the lower package power wiring line electrically connects the first semiconductor chip to a solder on a bottom surface of the lower package substrate.

19. The semiconductor package according to claim 16, wherein the semiconductor chip comprises a lower semiconductor chip and an upper semiconductor chip on the lower semiconductor chip,
wherein the upper semiconductor package further comprises a signal wire and a power wire,
wherein the upper package substrate comprises an upper chip signal wiring line, a lower chip signal wiring line, and a memory chip power wiring line,
wherein the signal wire is electrically connected to the upper semiconductor chip, and
wherein the upper chip signal wiring line electrically connects the signal wire to the signal connector.

20. The semiconductor package according to claim 16, wherein the semiconductor chip comprises a lower semiconductor chip and an upper semiconductor chip on the lower semiconductor chip,
wherein the upper semiconductor package further comprises a signal wire and a power wire,
wherein the upper package substrate comprises an upper chip signal wiring line, a lower chip signal wiring line, and a memory chip power wiring line,
wherein the signal wire is electrically connected to the lower semiconductor chip, and
wherein the lower chip signal wiring line electrically connects the signal wire to the signal connector.

21. The semiconductor package according to claim 1, wherein the exposed portion of the power connector is configured to contact a power bump for electrically connecting to an external board.

* * * * *